United States Patent [19]

Albanese

[11] 4,101,847

[45] Jul. 18, 1978

[54] LASER CONTROL CIRCUIT

[75] Inventor: Andres Albanese, Matawan, N.J.

[73] Assignee: Bell Telephone Laboratories, Incorporated, Murray Hill, N.J.

[21] Appl. No.: 737,846

[22] Filed: Nov. 1, 1976

[51] Int. Cl.² ............................................. H01S 3/13
[52] U.S. Cl. ............................... 331/94.5 S; 307/312
[58] Field of Search ................ 331/94.5 H, 94.5 S; 250/205; 307/311, 312; 250/199

[56] References Cited

U.S. PATENT DOCUMENTS

| 3,290,504 | 12/1966 | Vallese et al. | 250/199 |
| 3,657,543 | 4/1972 | Rose | 250/199 |
| 3,898,583 | 8/1975 | Shuey | 331/94.5 S |
| 3,931,512 | 1/1976 | Kent et al. | 250/199 |

Primary Examiner—Stanley D. Miller, Jr.
Assistant Examiner—James W. Davie
Attorney, Agent, or Firm—Stephen M. Gurey

[57] ABSTRACT

The operating current level of an injection laser is stabilized at a point of maximum linearity. A test signal modulates the laser current, and the operating current level of the laser is automatically adjusted until the harmonic distortion component in the output light at twice the test signal frequency is minimized.

11 Claims, 3 Drawing Figures

LASER CONTROL CIRCUIT

BACKGROUND OF THE INVENTION

This invention relates to injection lasers and, more particularly, to a circuit for controlling the operating current level of an injection laser.

Optical communication systems will play an important role in the development of future communication systems because of their large signal carrying capabilities. In such systems, information signals in either analog or digital form modulate the power output of a high intensity light source which is then transmitted over an optical transmission line such as an optical fiber. At the receiving end, the modulating signal is detected and the information signal is recovered. An injection laser can be used as a high intensity transmitting light source by varying the current through the laser in response to the information signal to be transmitted.

When analog frequency multiplexed signals are transmitted by an injection laser, the composite multiplexed analog signal modulates the laser current in the region in which the laser lases. The light power output is thus varied in accordance with the modulating signal. In order to minimize intermodulation distortion and cross-modulation between the different frequency multiplexed signals, the region over which the laser current is modulated must be within the most linear operating range of the laser. Distortion is minimized when the operating current level of the laser, for a zero magnitude modulating signal, is at the center of this linear operating range of the laser.

An object of the present invention is to operate an injection laser at a point of maximum linearity.

SUMMARY OF THE INVENTION

An injection laser is operated at a point of maximum linearity to permit frequency multiplexed signals to be optically transmitted with a minimum of intermodulation and cross-modulation distortion. In accordance with the present invention the operating current level of the injection laser is automatically adjusted to the point of inflection in the input current-versus-light power output characteristic of the laser. Such an operating point has been determined to be the point of minimum second order harmonic distortion. Accordingly, the operating current level of the laser is automatically adjusted until the second order harmonic distortion in the output light is minimized.

In one embodiment of the present invention, an ac test signal modulates the laser current and the harmonic distortion component in the output light at twice the test signal frequency is monitored. A feedback loop adjusts the laser operating point until this distortion is minimized. A second embodiment of the present invention utilizes the relationship that the distortion component in the voltage across an injection laser is proportional to the distortion component in the light output of the laser. Accordingly, in the second embodiment, the second harmonic distortion in the laser voltage is monitored and the operating point of the laser automatically adjusted until the second harmonic distortion in the laser voltage is minimized.

A feature of the present invention is that the operating point of the injection laser remains at the point of maximum linearity for all changes due to temperature variations and aging.

BRIEF DESCRIPTION OF THE DRAWINGS

FIG. 1, part B, shows the relationship between the laser current and the second harmonic distortion component in the output light;

FIG. 1, part C, shows the relationship between the laser current and a voltage that controls the operating current level of the laser;

DETAILED DESCRIPTION

Figure 1:
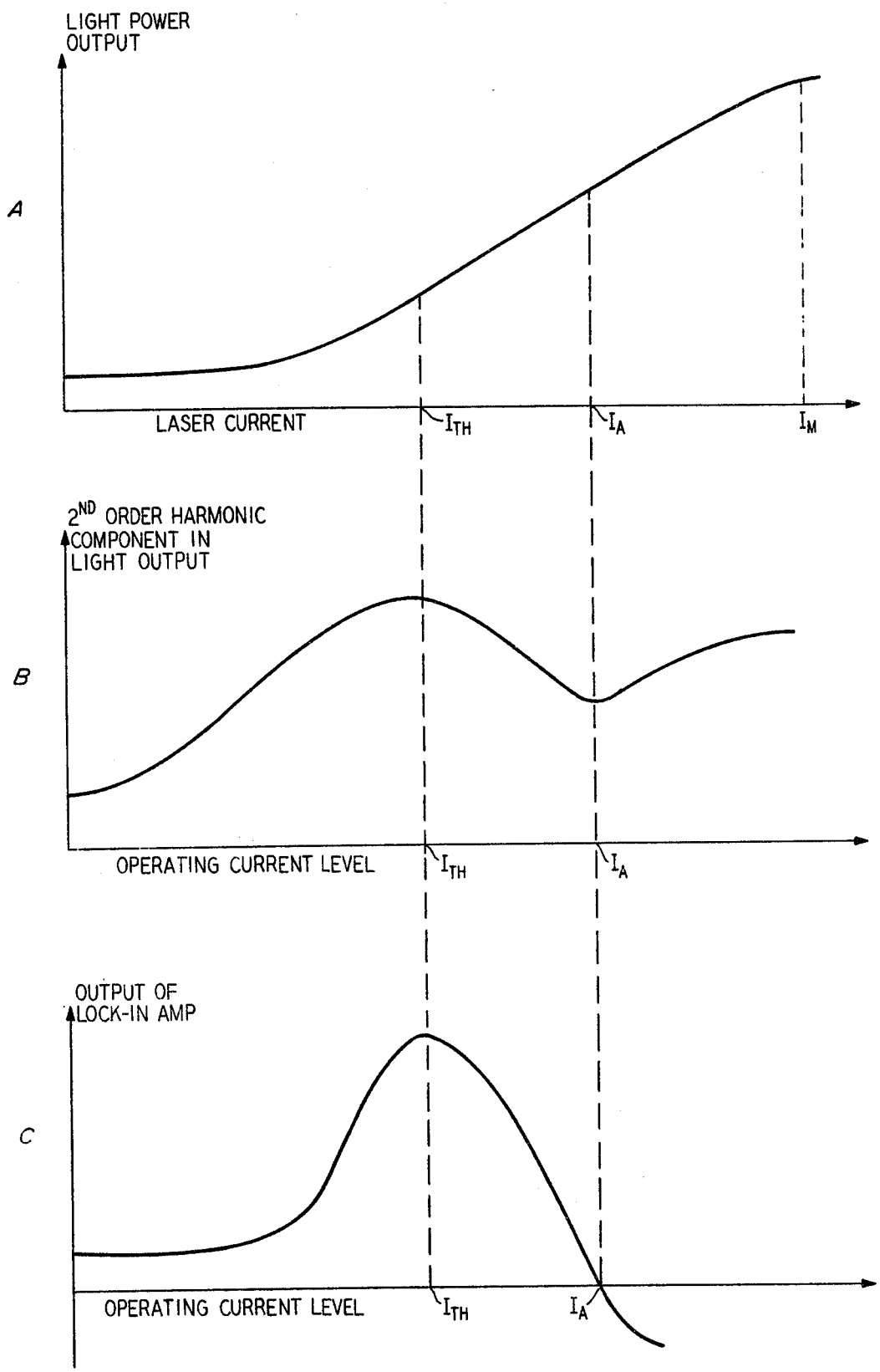
FIG. 1, part A, shows the relationship between the laser current and the light power output of an injection laser.

FIG. 1, part A, shows the relationship between the current through an injection laser and the magnitude of the light power output generated therefrom. At low current levels the laser functions essentially as an LED, but as the current increases the light power output increases with the current through the laser. As noted in FIG. 1, the threshold current at which the laser begins to lase is designated as $I_{TH}$. As the current through the laser increases above $I_{TH}$, an approximately linear relationship exists between the laser current and the light power output. This linear relationship exists until the laser current reaches an upper threshold, designated $I_M$ in FIG. 1, part A.

Information is transmitted by an injection laser by varying the laser current in a predetermined manner in response to an information signal. By modulating the magnitude of the laser current within the range of $I_{TH}$ and $I_M$ in response to the information signal, the power light output is similarly modulated. Since, however, the relationship between laser current and the light power output of the injection laser is not perfectly linear between the $I_{TH}$ and $I_M$, intermodulation distortion and cross-modulation distortion between channels results. In order to minimize such distortion, it is desirable that the laser operating current level, or zero signal level, be at the center of the most linear region and remain there for all changes due to temperature variations and aging. This operating current level, designated $I_A$ in FIG. 1, part A, is at the mathematical point of inflection in the laser current-versus-light power output characteristic. When the laser operating current level is at this point, the harmonic distortion of an analog signal modulated onto the laser current is minimized. Since the second order harmonic distortion is the dominant intermodulation component, the optimum operating current level is determined by minimizing the second order harmonic modulation component.

Figure 2:
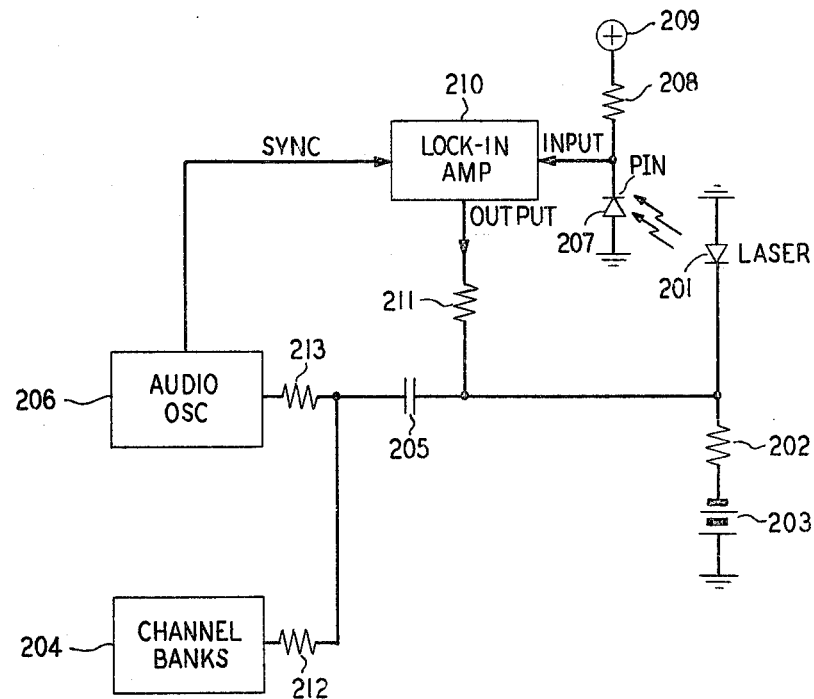
FIG. 2 is a first embodiment of the present invention.

FIG. 2 is an embodiment of the present invention which automatically adjusts the operating current level of an injection laser to the optimum value and maintains it throughout the operation of the laser. An Aluminum-Gallium-Arsenide injection laser 201 is dc biased by power source 203 through resistor 202. Power source 203 biases laser 201 so that the constant laser current is above the threshold level $I_{TH}$. Accordingly, at this level, laser 201 lases and emits a high intensity light beam. In order for the laser to transmit information signals, the frequency multiplexed information signals from channel banks 204 are coupled through a resistor 212 and a capacitor 205 to laser 201. The frequency multiplexed signals, having individual carrier frequencies which are proximate to 1 megahertz, modulate the current through the laser and thus also the light power output of the laser.

In addition to the information signals which are coupled to the laser, a 10 kHz sinusoidal test signal generated by an audio oscillator 206 is coupled through a resistor 213 and capacitor 205 to laser 201. The sinusoidal test signal also modulates the laser current and the light power generated by the laser. A PIN photodetector diode 207, biased by a power source 209 through resistor 208, detects the light output of laser 201 and converts it to an electrical signal. The output of diode 207 is connected to a lock-in amplifier 210, such as the Lock-in Amplifier No. 124 produced by Princeton Applied Research, Inc. Lock-in amplifier 210 is tuned at 20 kHz, twice the frequency of oscillator 206. In addition, amplifier 210 is phase synchronized with oscillator 206. Amplifier 210 filters and detects the phase and amplitude of the second order harmonic component of the test signal in the output light of laser 201 and generates a dc output voltage having a phase representative of the phase of the second order harmonic component.

FIG. 1, part B, illustrates the second order harmonic component of the test signal in the output light generated by laser 201 as a function of the operating current level of the laser. As can be noted, the second order harmonic component is at a minimum when the operating current level is $I_A$, the point of inflection in the laser characteristic of FIG. 1, part A. Accordingly, as aforenoted, by minimizing the second order harmonic component, the operating current of the laser will be at its optimum, most linear level. In order to minimize the second order harmonic component, the dc signal at the output of lock-in amplifier 210 is connected through resistor 211 to laser 201 to adjust its operating current level. FIG. 1, part C, illustrates the output of lock-in amplifier 210 as a function of the laser's operating current level. The dc output voltage of lock-in amplifier 210 is negative or positive depending upon the phase of the second harmonic component in the light output. When the operating level of the laser is below the optimum operating level $I_A$, the output of lock-in amplifier 210 is a positive voltage which increases the laser's operating current to $I_A$. Similarly, when the laser is operating at a level about $I_A$, the output of amplifier 210 is a negative voltage which decreases the laser's operating current to $I_A$. With such a feedback arrangement, therefore, the operating current level of laser 201 is stabilized at $I_A$. In addition, the circuit automatically compensates for any changes in the threshold current or power supply voltage due to temperature variations or aging.

Figure 3:
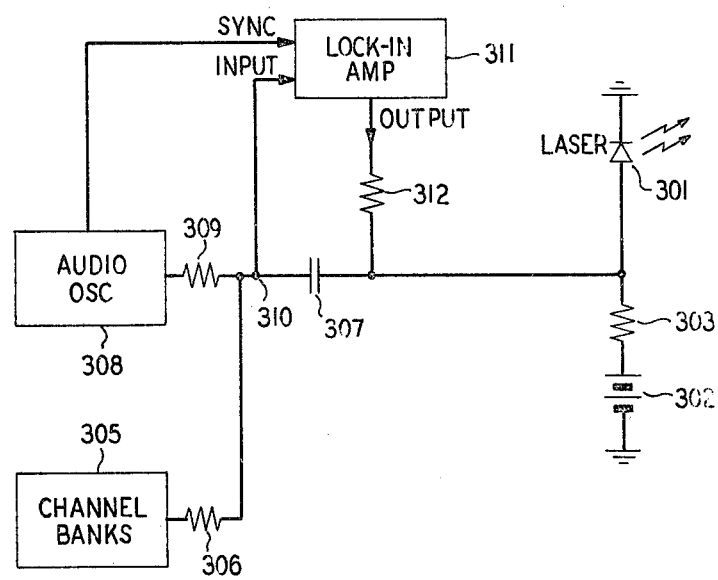
FIG. 3 is a second embodiment of the present invention.

A second embodiment of the present invention is illustrated in FIG. 3. In accordance with this embodiment, the second order harmonic distortion component in the laser voltage is monitored thereby eliminating the photodetecting link in the previously described embodiment. In particular, this embodiment recognizes the complementary relationship between the harmonic distortion components in the laser voltage and in the laser light. The laser is automatically stabilized at the optimum operating current level by minimizing the second order harmonic distortion components in the laser voltage instead of the laser light.

With reference to FIG. 3, injection laser 301 is biased by a power source 302 through a resistor 303. Channel banks 305 are coupled to laser 301 through resistor 306 and capacitor 307 to modulate the laser current in response to the information signals to be transmitted on the laser output light. A 10 kHz sinusoidal test signal is generated by an audio oscillator 308 and coupled to laser 301 through resistor 309 and capacitor 307 to also modulate the laser current. The ac voltage of laser 301 at node 310 is coupled to lock-in amplifier 311, which is phase synchronized with oscillator 308 and synchronized at 20 kHz, twice the frequency of audio oscillator 308. Lock-in amplifier 311 filters and detects the phase and amplitude of the second order harmonic distortion component of the test signal in the ac output voltage of laser 301 and generates an output voltage having a phase representative of the phase of the second order harmonic component as is also shown in FIG. 1, part C. The output of lock-in amplifier 311 is connected to laser 301 through resistor 312. As heretofore described in connection with the embodiment of FIG. 2, the operating current level of laser 301 is stabilized at its optimum level $I_A$ by automatically adjusting the operating current level until the second order harmonic distortion component in the laser output voltage is minimized.

The above-described arrangements are illustrative of the application and principles of the invention. Other embodiments may be devised by those skilled in the art without departing from the spirit and scope of the invention.

What is claimed is:

1. Apparatus for controlling the operating current level of an injection laser so that said injection laser operates at the point of maximum linearity comprising:
    means for modulating the current through said injection laser with a test signal at a predetermined frequency; and
    means for detecting the harmonic distortion component in the light output of said laser at twice said predetermined frequency and for automatically adjusting said operating current level for the minimum harmonic distortion component.

2. Apparatus as defined in claim 1 wherein said means for detecting the harmonic distortion component includes means for generating a dc signal having a first phase when the operating current level is above the point of maximum linearity and a second phase when said operating current level is below the point of maximum linearity.

3. Apparatus as defined in claim 2 wherein said means for detecting the harmonic distortion includes a lock-in amplifier phase-synchronized to said test signal.

4. Apparatus for maintaining the operating current level of an injection laser at the point of maximum linearity comprising:
    means for modulating the current through said injection laser with a test signal having a predetermined frequency;
    means for detecting the light generated by said laser in response to the modulated current through said laser; and
    means for detecting the second order harmonic distortion component of said test signal in said detected light and for automatically adjusting said operating current level for the minimum second order harmonic distortion component.

5. Apparatus as defined in claim 4 wherein said means for detecting the light generated by said laser is a PIN photodetecting diode.

6. Apparatus as defined in claim 4 wherein said means for detecting the second order harmonic distortion component and for automatically adjusting said operating current level includes means for generating a dc signal having a first phase when the operating current level is above the point of maximum linearity and a second phase when said operating current level is below the point of maximum linearity.

7. Apparatus as defined in claim 6 wherein said means for detecting the second order harmonic distortion component and for automatically adjusting said operating current level is a lock-in amplifier phase-synchronized to said test signal.

8. Apparatus for maintaining the operating current level of an injection laser at the point of maximum linearity;
- means for modulating the current through said injection laser with a test signal having a predetermined frequency, the current through said injection laser being at said operating current level for a zero test signal magnitude;
- means for detecting the laser voltage in response to the modulated current through said laser; and
- means for detecting the second order harmonic distortion component in said voltage and for automatically adjusting said operating current level for the minimum second order harmonic distortion component.

9. Apparatus as defined in claim 8 wherein said means for detecting the second order harmonic distortion component and for automatically adjusting said operating current level includes means for generating a dc signal having a first phase when the operating current level is above the point of maximum linearity and a second phase when said operating current level is below the point of maximum linearity.

10. Apparatus as defined in claim 9 wherein said means for detecting the second order harmonic distortion component and for automatically adjusting said operating current level is a lock-in amplifier phase synchronized to said test signal.

11. In combination an injection laser, means for biasing said laser, a plurality of channel banks connected to said laser for modulating the current through said laser in response to a plurality of frequency multiplexed information signals, an audio oscillator for modulating the current through said laser at a predetermined test frequency, a PIN photodetector diode for detecting the light output of said laser, a lock-in amplifier phase-synchronized with the output of said audio oscillator and frequency-synchronized at twice said predetermined test frequency for measuring the second harmonic distortion component in the laser light detected by said PIN diode generated in response to the modulation of the current through said laser by said audio oscillator, said lock-in amplifier generating a dc voltage in response to said second harmonic distortion component for automatically stabilizing the operating current level of said laser at the point of inflection in the laser current-versus-light power output characteristic of said laser, said dc voltage having a first phase or polarity when the operating current level of said laser is above the said point of inflection and a second phase or polarity when the operating current level is below said point of inflection.

* * * * *